US010957850B2

(12) United States Patent
Dutta et al.

(10) Patent No.: US 10,957,850 B2
(45) Date of Patent: Mar. 23, 2021

(54) MULTI-LAYER ENCAPSULATION TO ENABLE ENDPOINT-BASED PROCESS CONTROL FOR EMBEDDED MEMORY FABRICATION (71) Applicant: INTERNATIONAL BUSINESS MACHINES CORPORATION, Armonk, NY (US)

(72) Inventors: Ashim Dutta, Menands, NY (US); Isabel Cristina Chu, Melrose, NY (US); Son Nguyen, Schenectady, NY (US); Michael Rizzolo, Albany, NY (US); John C. Arnold, North Chatham, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/151,401

(22) Filed: Oct. 4, 2018

(65) Prior Publication Data
US 2020/0111951 A1 Apr. 9, 2020

(51) Int. Cl.
*H01L 29/82* (2006.01)
*H01L 43/12* (2006.01)
*H01L 43/10* (2006.01)
*H01L 43/08* (2006.01)
*H01L 27/22* (2006.01)

(52) U.S. Cl.
CPC ............ *H01L 43/12* (2013.01); *H01L 27/226* (2013.01); *H01L 43/08* (2013.01); *H01L 43/10* (2013.01)

(58) Field of Classification Search
CPC ......... H01L 43/12; H01L 43/08; H01L 43/10; H01L 27/226
USPC ....................................................... 257/421
See application file for complete search history.

(56) References Cited

U.S. PATENT DOCUMENTS

| | | | |
|---|---|---|---|
| 4,839,311 | A | 6/1989 | Riley et al. |
| 5,747,380 | A | 5/1998 | Yu et al. |
| 6,004,829 | A | 12/1999 | Chang et al. |
| 6,258,497 | B1 | 7/2001 | Kropp et al. |
| 6,265,319 | B1 | 7/2001 | Jang |
| 6,573,188 | B1 | 6/2003 | Lai et al. |
| 6,900,123 | B2 | 5/2005 | Jiang et al. |
| 8,263,496 | B1 | 9/2012 | Wodecki |
| 8,669,181 | B1 | 3/2014 | Yu et al. |
| 8,704,288 | B2 | 4/2014 | Lee et al. |
| 9,059,028 | B2 * | 6/2015 | Tada ..................... H01L 27/101 |
| 9,275,916 | B2 | 3/2016 | Fuergut et al. |

(Continued)

OTHER PUBLICATIONS

Xu, "A Breakthrough in Low-k Barrier/Etch Stop Films for Copper Damascene Applications", Semiconductor Fabtech, 11th Edition, Mar. 2000, pp. 239-244.

*Primary Examiner* — Tan N Tran
(74) *Attorney, Agent, or Firm* — Tutunjian & Bitetto, P.C.; James Nock (57) ABSTRACT

A method for fabricating a semiconductor device includes forming a first encapsulation layer along the device, including forming the first encapsulation layer along a memory device region associated with a memory device, forming an intermediate layer on the first encapsulation layer to enable etch endpoint detection and endpoint-based process control for encapsulation layer etch back, and forming a second encapsulation layer on the intermediate layer.

18 Claims, 8 Drawing Sheets

(56) References Cited

U.S. PATENT DOCUMENTS

| | | | |
|---|---|---|---|
| 9,331,124 B2* | 5/2016 | Park | H01L 27/2454 |
| 9,373,500 B2* | 6/2016 | Swaminathan | H01L 43/12 |
| 9,893,278 B1* | 2/2018 | Chuang | H01L 27/222 |
| 10,163,651 B1* | 12/2018 | Chen | H01L 45/1675 |
| 10,199,572 B2* | 2/2019 | Yi | H01L 27/228 |
| 2017/0222128 A1 | 8/2017 | Sung et al. | |
| 2018/0375018 A1 | 12/2018 | Deshpande et al. | |
| 2019/0207083 A1* | 7/2019 | Zhong | G11C 11/161 |

* cited by examiner

MULTI-LAYER ENCAPSULATION TO ENABLE ENDPOINT-BASED PROCESS CONTROL FOR EMBEDDED MEMORY FABRICATION

BACKGROUND

Technical Field

The present invention generally relates to semiconductor devices, and more particularly to multi-layer encapsulation to enable endpoint-based process control for embedded memory fabrication.

Description of the Related Art

A memory cell is a component of a computer memory device that includes an electronic circuit that stores one bit of binary information. One type of memory cell is a random-access memory (RAM) cell. Examples of RAM memory devices include, e.g., volatile memory devices and non-volatile memory devices. One example of a non-volatile memory is magnetoresistive random-access memory (MRAM). In contrast to other RAM technologies, data in MRAM is not stored as electric charge or current flows, but by using magnetic storage elements. More specifically, MRAM can use a component called a magnetic tunnel junction (MTJ) to exploit the phenomenon of tunnel magnetoresistance (TMR)

SUMMARY

In accordance with an embodiment of the present invention, a method for fabricating a semiconductor device is provided. The method includes forming a first encapsulation layer along the device, including forming the first encapsulation layer along a memory device region associated with a memory device, forming an intermediate layer on the first encapsulation layer to enable etch endpoint detection and endpoint-based process control for encapsulation layer etch back, and forming a second encapsulation layer on the intermediate layer.

In accordance with another embodiment of the present invention, a method for fabricating a semiconductor device is provided. The method includes forming a first encapsulation layer along the device, including forming the first encapsulation layer along a memory device region associated with a magnetoresistive random-access memory (MRAM) device, forming an intermediate layer on the first encapsulation layer having a thickness of at least about 5 nm to enable etch endpoint detection and endpoint-based process control for encapsulation layer etch back, and forming a second encapsulation layer on the intermediate layer.

In accordance with yet another embodiment of the present invention, a semiconductor device is provided. The device includes a memory device region associated with a memory device, a first encapsulation layer disposed along the memory device region, an intermediate layer disposed on the first encapsulation layer, and a second encapsulation layer disposed on the intermediate layer.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

In a magnetoresistive random-access memory (MRAM) device, the elements are formed from two ferromagnetic plates, each of which can hold a magnetic field, separated by an insulating layer. In some embodiments, one of the two plates is a permanent or fixed magnet set to a particular polarity, and the other plate's field can be changed to match that of an external field to store memory. The MRAM device is built from a grid of such "cells". The simplest method of reading is accomplished by measuring the electrical resistance of the cell. A particular cell is (typically) selected by powering an associated transistor that switches current from a supply line through the cell to ground. Due to the magnetic tunnel effect, the electrical resistance of the cell changes due to the orientation of the fields in the two plates. By measuring the resulting current, the resistance inside any particular cell can be determined, and from this the polarity of the writable plate. Typically, if the two plates have the same polarity this is considered to mean "1", while if the two plates are of opposite polarity the resistance will be higher and this means "0". Data is written to the cells using a variety of means. In one embodiment, each cell may be positioned between a pair of write lines arranged at right angles to each other, above and below the cell. When current is passed through them, an induced magnetic field is created at the junction, which the writable plate picks up.

Conventional integration schemes for embedded memory fabrication (e.g., embedded MRAM fabrication) use a single encapsulation layer, which needs to be etched back using a timed etch process. However, it is very difficult to achieve process reproducibility using a single encapsulation layer, since the timed etch process can only blindly stop in film and may not compensate for incoming film thickness variation. Moreover, a tight control of film remaining on the top of the-electrode in the memory region and underlying metal lines in the logic region can be needed, since a following dielectric etch step for interconnect formation is also a blind etch step that requires a tight control of over etch to avoid damage to the logic region.

To address at least the above-noted problems with current integration schemes, the embodiments described herein provide for multi-layer encapsulation to enable endpoint based process control for embedded memory fabrication. The multi-layer encapsulation can incorporate a plurality of encapsulation layers, including a first encapsulation layer and a second encapsulation layer, and an intermediate layer located between the first and second encapsulation layers. The intermediate layer can be a thin layer (e.g., can have a thickness of at least about 5 nm) including dielectric material to enable etch endpoint detection, thereby enabling endpoint-based process control for the encapsulation layer etch back process. The intermediate layer can prevent crack propagation between the first and second encapsulation layers. The embodiments described herein can allow better overall etch control for dielectric etch due to less incoming cap thickness variation. The embodiments described herein can be implemented in any suitable point in the device fabrication process (e.g., during back-end-of-line BEOL processing).

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above"

the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 1:
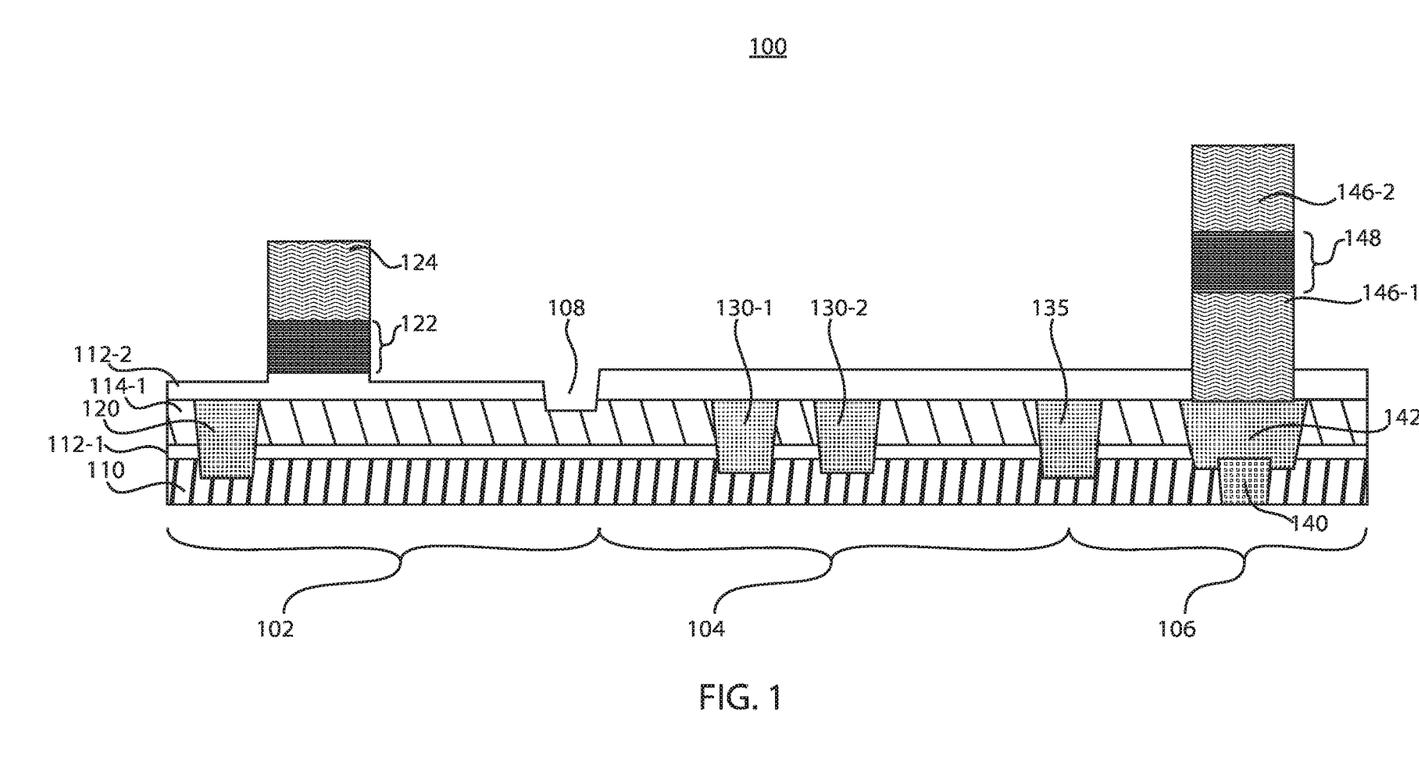
FIG. 1 is a cross-sectional view of post memory device patterning performed during the fabrication of a semiconductor device, in accordance with an embodiment of the present invention.

Referring now to the drawings in which like numerals represent the same or similar elements and initially to FIG. 1, a cross-sectional view of a semiconductor device 100 is provided. The device 100 is shown having a plurality of regions, including an alignment or kerf region 102, a logic region 104, and a memory region 106. A trench or gap 108 is disposed between the alignment region 102 and the logic region 104. That is, the device 100 can illustratively include memory and logic co-existing on the same chip. In this illustrative embodiment, the device 100 includes a magnetoresistive random-access memory (MRAM) device. However, the device 100 can include any suitable memory device(s) in accordance with the embodiments described herein.

As shown in FIG. 1, the device 100 includes a dielectric layer 110, cap layers 112-1 and 112-2, interlayer dielectric (ILD) 114 formed across each of the regions 102-106. The dielectric layer 110 can include any suitable material in accordance with the embodiments described herein. The cap layers 112-1 and 112-2 can include any suitable material in accordance with the embodiments described herein. For example, the cap layers 112-1 and 112-2 can include, e.g., a silicon nitride material (e.g., SiN), a silicon carbide material (e.g., SiC), a silicon carbonitride material (e.g., SiCN), a silicon oxynitride material (SiON), a silicon oxycarbonitride material (e.g., SiCNO), etc.

The ILD 114 can include any suitable material in accordance with the embodiments described herein. In one embodiment, the ILD 114 can include a low-k dielectric material. A low-k dielectric material is a dielectric material that includes a dielectric constant (k) less than about 3.9, which corresponds to the dielectric constant of $SiO_2$. For example, the ILD 114 can include a dielectric material having a dielectric constant ranging from about 1.0 to about 3.0. In one embodiment, the ILD 114 can include an ultra low-k (ULK) dielectric material. The ILD 114 can be formed with a low-k dielectric material or an ULK dielectric material to reduce parasitic phenomena such as, e.g., resistance-capacitance delay, crosstalk and power dissipation. Examples of suitable materials for the ILD 114 include, but are not limited to, a carbon doped oxide dielectric material (e.g., SiCOH or porous SiCOH), a fluorinated silicon oxide material (e.g., SiOF), a spin-on methyl-silisesquioxane (MSQ), an organic polymer, etc.

Turning to the alignment region 102, the alignment region 102 further includes an alignment region line 120, an alignment region memory device stack 122 and an alignment region contact 124.

Turning to the logic region 104, the logic region 104 can include logic region lines 130-1 and 130-2. The logic region lines 130-1 and 130-2 can include any suitable conductive material in accordance with the embodiments described herein. For example, the logic region lines 130-1 and 130-2 can include, e.g., copper (Cu). A boundary line 135 is located at the boundary of the logic region 104 and the memory region 106. The boundary line 135 can include any suitable material in accordance with the embodiments described herein. For example, the boundary line 135 can include, e.g., copper (Cu).

Turning to the memory region 106, the memory region 106 can include conductive structures, including a contact 140 and a memory region line 142 formed on the contact 140. The conductive structures 140 and 142 can include any suitable material in accordance with the embodiments described herein. Examples of suitable materials for the contact 140 and memory region line 142 can include, but are not limited to, copper (Cu), tungsten (W), cobalt (Co), etc.

The memory region 106 further includes a bottom electrode 146-1 formed on the memory region line 142 and the cap layer 112-2, a stack 148 formed on the bottom electrode 146-1, and a top electrode 146-2 formed on the stack 148. Although bottom electrode 146-1 is shown as having a height greater than top electrode 146-2 in FIG. 1, in other embodiments, bottom electrode 146-1 can have a height less than or equal to that of top electrode 146-2.

The bottom and top electrodes 146-1 and 146-2 can include any suitable material in accordance with the embodiments described herein. Examples of suitable materials for the bottom and top electrodes 146-1 and 146-2 include, but are not limited to, tantalum nitride (TaN), ruthenium (Ru), tantalum (Ta), tungsten (W), titanium nitride (TiN), titanium (Ti), molybdenum (Mo), chromium (Cr), aluminum (Al), a silicide, etc. Additionally, the top and bottom electrodes 146-1 and 146-2 can be formed using any suitable process in accordance with the embodiments described herein. Examples of suitable processes that can be used to form the top and bottom electrodes 146-1 and 146-2 include, but are not limited to, physical vapor deposition (PVD), ionized PVD (I-PVD), chemical vapor deposition (CVD), plasma-enhanced CVD (PECVD), atomic layer deposition (ALD), electroplating, electrodeless plating, etc.

The stack 148 can form a magnetic tunnel junction (MTJ) of an MRAM device. For example, the stack 148 can include a fixed magnetic plate and a free magnetic plate separated by an insulating (e.g., dielectric) layer that serves as a tunneling layer. The insulating layer of the stack 148 can be thin (e.g., a few nanometers thick) and can include any suitable material in accordance with the embodiments described herein. For example, the insulating layer of the stack 148 can include, e.g., magnesium oxide (MgO). The fixed magnetic plate of the stack 148 can include one or more layers that maintain a fixed magnetization direction, and the free magnetic plate of the stack 148 can include one or more layers that can rotate between parallel and antiparallel states with respect to the fixed magnetic layer of the stack 148 based on the direction of current flow through the stack 148. The fixed magnetic layer and the free magnetic layer of the stack 148 can include any suitable materials in accordance with the embodiments described herein. For example, at least one of the fixed magnetic layer and the free magnetic layer of the stack 148 can include, e.g., a cobalt-iron-boron alloy (e.g., CoFeB).

Figure 2:
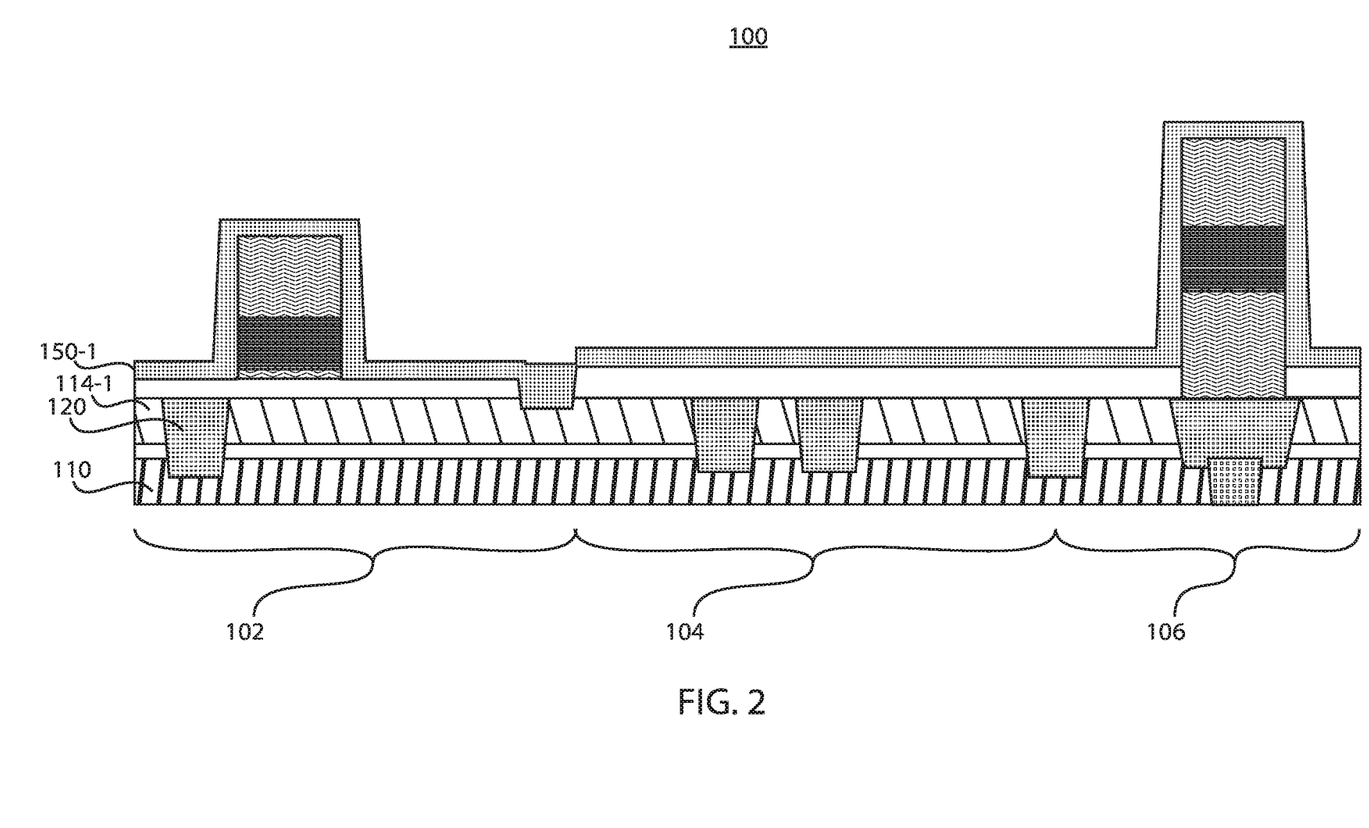
FIG. 2 is a cross-sectional view of the formation of a first encapsulation layer formed during the fabrication of the semiconductor device, in accordance with an embodiment of the present invention.

With reference to FIG. 2, a first encapsulation layer 150-1 is formed along the regions 102-106 of the device 100. For example, the first encapsulation layer 150-1 can be conformally deposited along the regions 102-106 of the device 100 using any suitable conformal deposition process. The first encapsulation layer 150-1 can include any suitable material in accordance with the embodiments described herein. Examples of suitable materials for the first encapsulation layer 150-1 include, but are not limited to, a silicon nitride material (e.g., SiN), a silicon carbide material (e.g., SiC), a silicon carbonitride material (e.g., SiCN), a silicon oxynitride material (e.g., SiON), a silicon oxycarbonitride material (e.g., SiCNO), a hafnium oxide material (e.g., $HfO_2$), an aluminum oxide material (e.g., $Al_2O_3$), etc. (and combinations thereof).

Figure 3:
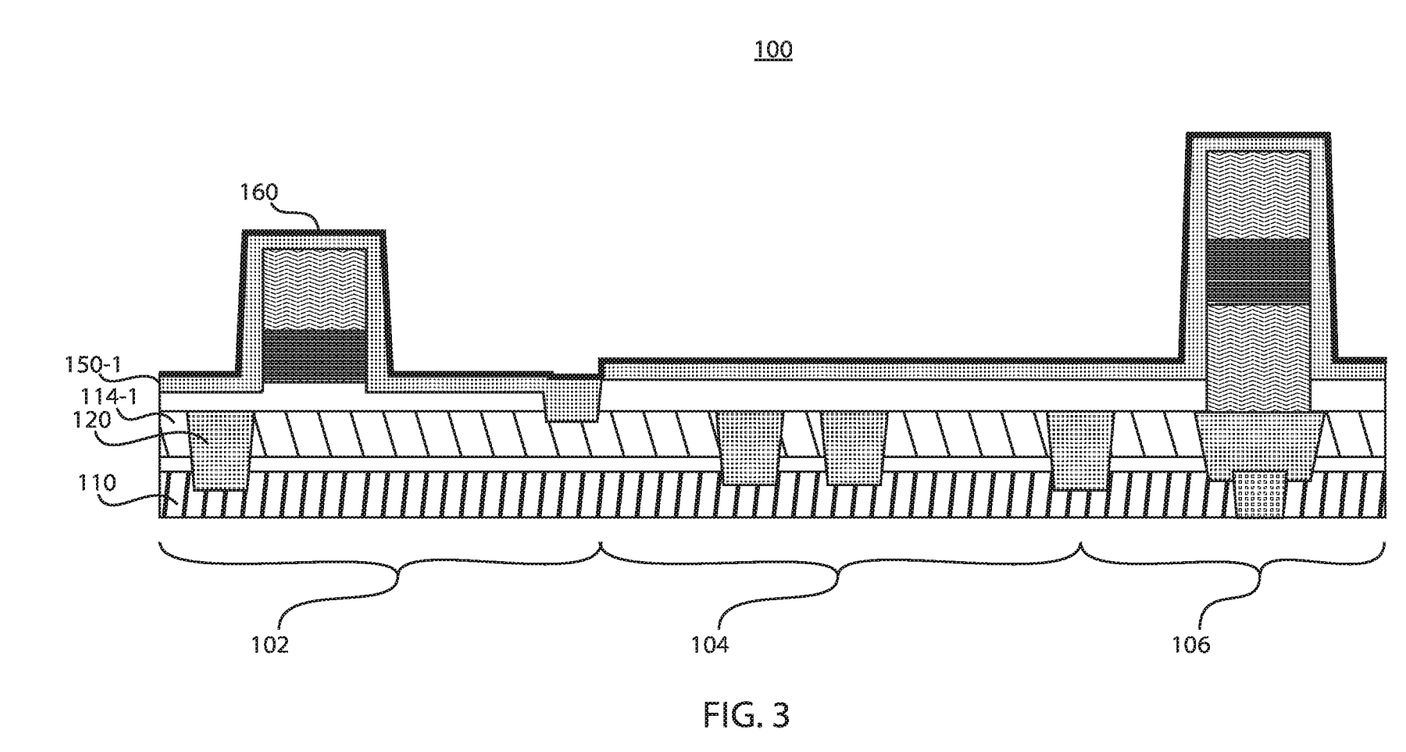
FIG. 3 is a cross-sectional view of the formation of an intermediate layer formed during the fabrication of the semiconductor device, in accordance with an embodiment of the present invention.

With reference to FIG. 3, an intermediate layer 160 is formed on the first encapsulation layer 150-1. The intermediate layer 160 can include a different material than the first encapsulation layer 150-1. In one embodiment, the intermediate layer 160 is a thin layer. For example, the intermediate layer 160 can have a thickness of, e.g., at least about 5 nm. The intermediate layer 160 can include any suitable material in accordance with the embodiments described herein. Examples of suitable materials for the intermediate layer 160 include, but are not limited to, a silicon oxycarbide material (e.g., SiOC or SiCOH), a silicon nitride material (e.g., SiN), a silicon oxynitride material (SiON), a silicon carbonitride material (e.g., SiCN), a silicon oxycarbonitride material (e.g., SiCNO), an aluminum oxide material (e.g., $Al_2O_3$), an aluminum oxynitride material (e.g., $AlN_xO_y$), a hafnium oxide material (e.g., $HfO_2$), etc. (and combinations thereof).

In one embodiment, forming the intermediate layer 160 includes conformally forming the material of the intermediate layer 160 on the first encapsulation layer 150-1. For example, an oxygen bearing (e.g., oxygen gas ($O_2$), nitrous oxide ($N_2O$), carbon dioxide ($CO_2$), or carbon monoxide (CO)) plasma treatment can be used to modify the dielectric material of the first encapsulation layer 150-1. As another example, a nitrogen bearing (e.g., nitrogen gas ($N_2$) or ammonia ($NH_3$) plasma treatment can be used to modify the dielectric material of the first encapsulation layer 150-1. As yet another example, a multi-step encapsulation layer deposition can be performed to obtain a precise thickness on the sidewalls and top.

In another embodiment, forming the intermediate layer 160 includes non-conformally forming the material of the intermediate layer 160 on the first encapsulation layer 150-1. For example, a thin film deposition process can be used to deposit a thin film of the dielectric material of the intermediate layer 160 (e.g., employing CVD, PECVD, high density CVD (HDCVD), electron cyclotron resonance (ECR) and/or PVD). As another example, the intermediate layer 160 can be formed by using spin coating or deposition of a flowable dielectric material (e.g., SiCN or SiCOH).

In yet another embodiment, forming the intermediate layer 160 includes forming the material of the intermediate layer 160 by using an implantation process to modify the first encapsulation layer 150-1. For example, the implantation can be done by using ion implantation, a gas cluster ion beam, an accelerated neutral atom beam, etc. The implantation species can be, e.g., carbon (C), oxygen (O), sulfur (S), nitrogen (N), or an oxidizable material. Examples of oxidizable materials include, but are not limited to, aluminum (Al), silicon (Si), hafnium (Hf), etc. (and combinations thereof).

Figure 4:
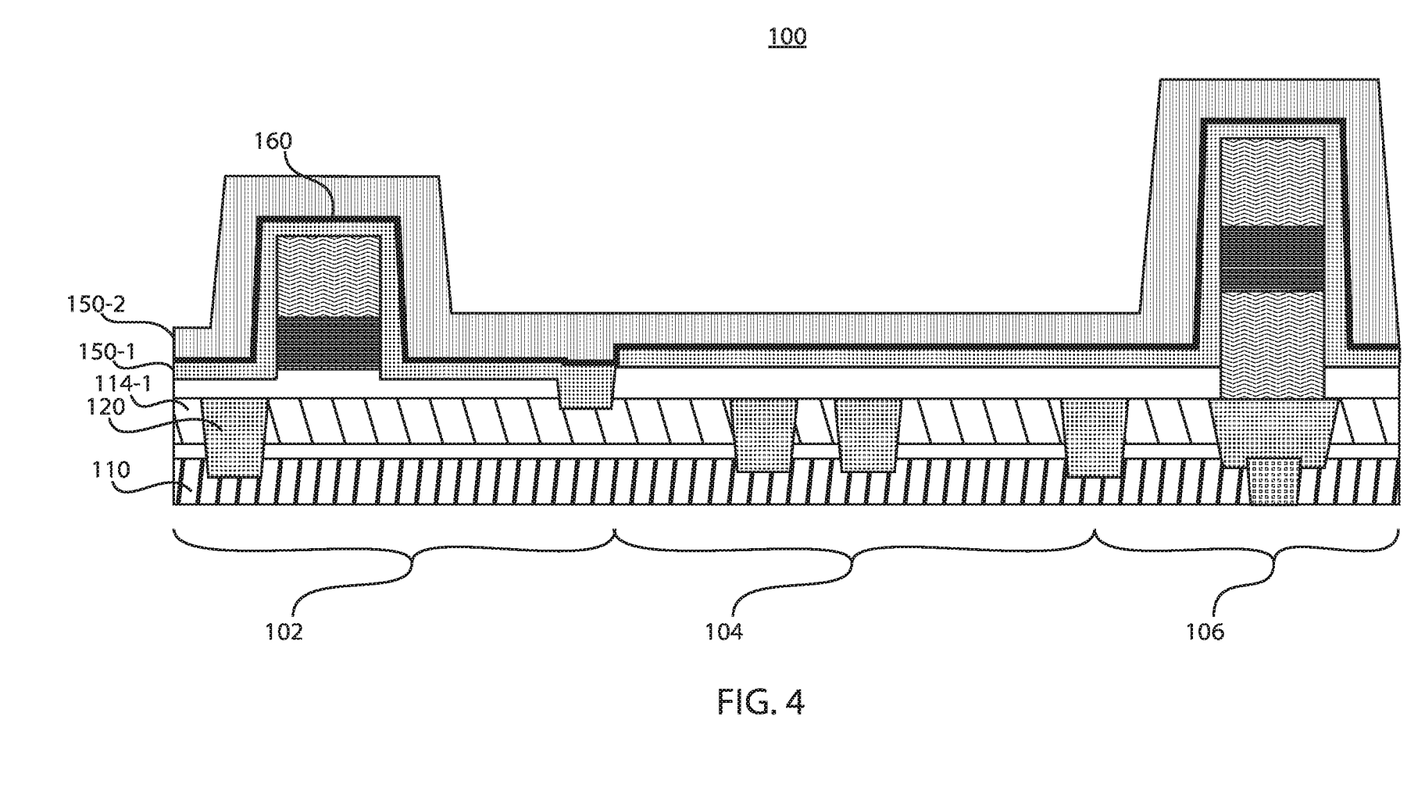
FIG. 4 is a cross-sectional view of the formation of a second encapsulation layer during the fabrication of the semiconductor device, in accordance with an embodiment of the present invention.

With reference to FIG. 4, a second encapsulation layer 150-2 is formed on the intermediate layer 160. For example, the second encapsulation layer 150-2 can be conformally deposited along the intermediate layer 160 using any suitable conformal deposition process. The second encapsulation layer 150-2 can include any suitable material in accordance with the embodiments described herein. Examples of suitable materials for the second encapsulation layer 150-2 include, but are not limited to, a silicon nitride material (e.g., SiN), a silicon carbide material (e.g., SiN), a silicon carbonitride material (e.g., SiCN), a silicon oxynitride material (e.g., SiON), a silicon oxycarbonitride material (e.g., SiCNO), a hafnium oxide material (e.g., $HfO_2$), an aluminum oxide material (e.g., $Al_2O_3$), etc. (and combinations thereof).

The second encapsulation layer 150-2 can include a different material than the intermediate layer 160. In one embodiment, the second encapsulation layer 150-2 can include the same material as the first encapsulation layer 150-1. In another embodiment, the second encapsulation layer 150-2 can include a different material from the first encapsulation layer 150-1.

Figure 5:
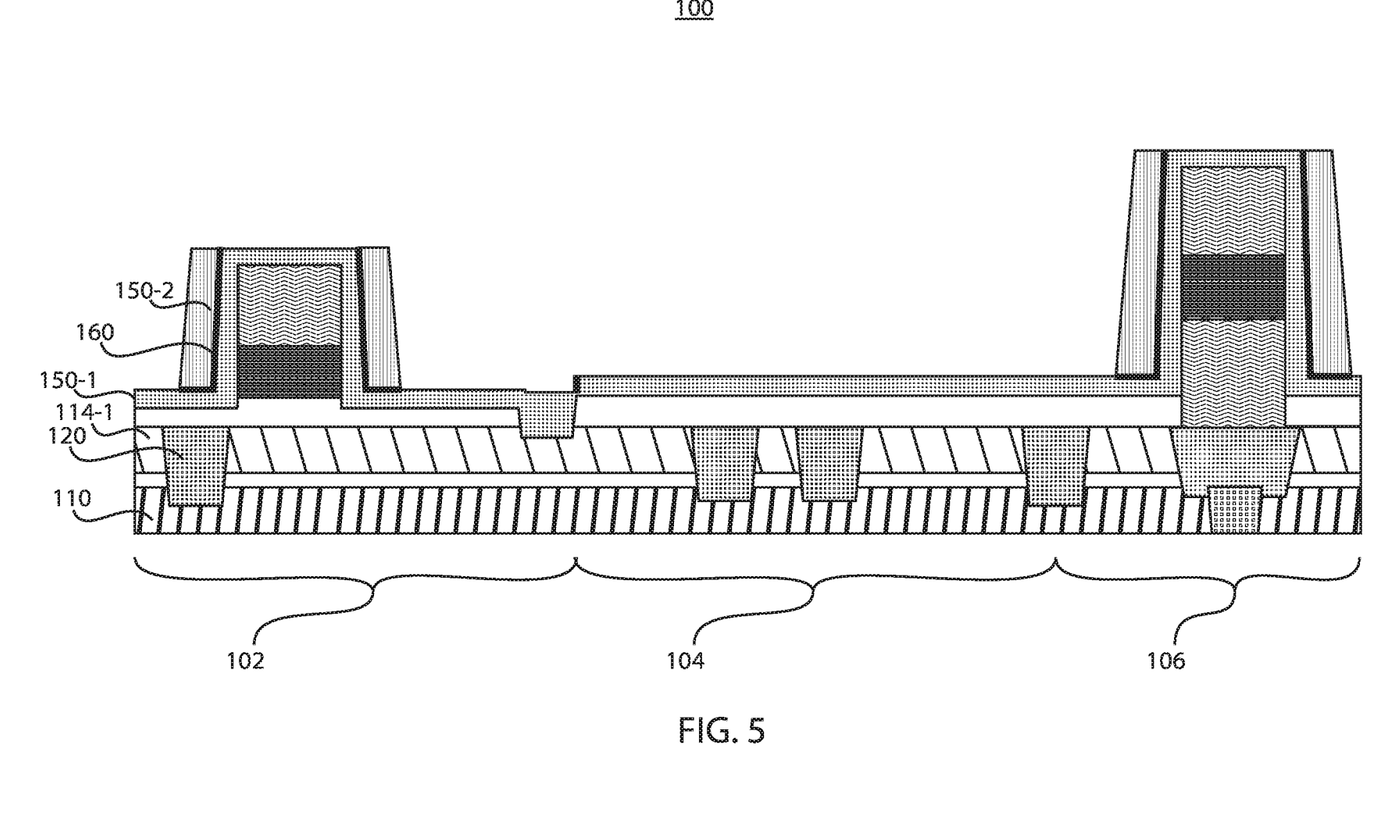
FIG. 5 is a cross-sectional view of the encapsulation layer etch back performed during the fabrication of the semiconductor device, in accordance with an embodiment of the present invention.

With reference to FIG. 5, encapsulation layer etch back is performed. The intermediate layer 160 formed in accordance with the embodiments described herein enables etch endpoint detection and endpoint-based process control for the encapsulation layer etch back. The encapsulation layer etch back process is stopped based on an end point signal once the top layer of encapsulation clears in the open area. In this illustrative embodiment, an anisotropic etch process can be used to perform the encapsulation layer etch back. As shown, this can result in the intermediate layer 160 being removed from the lateral surface, but remaining on the sidewall due to slower etch rate at the sidewall caused by the anisotropic etch process. Additionally, the intermediate layer can prevent crack propagation between the first and second encapsulation layers. The first encapsulation layer 150-1 can remain in the final product to meet total cap thickness requirements.

Figure 6:
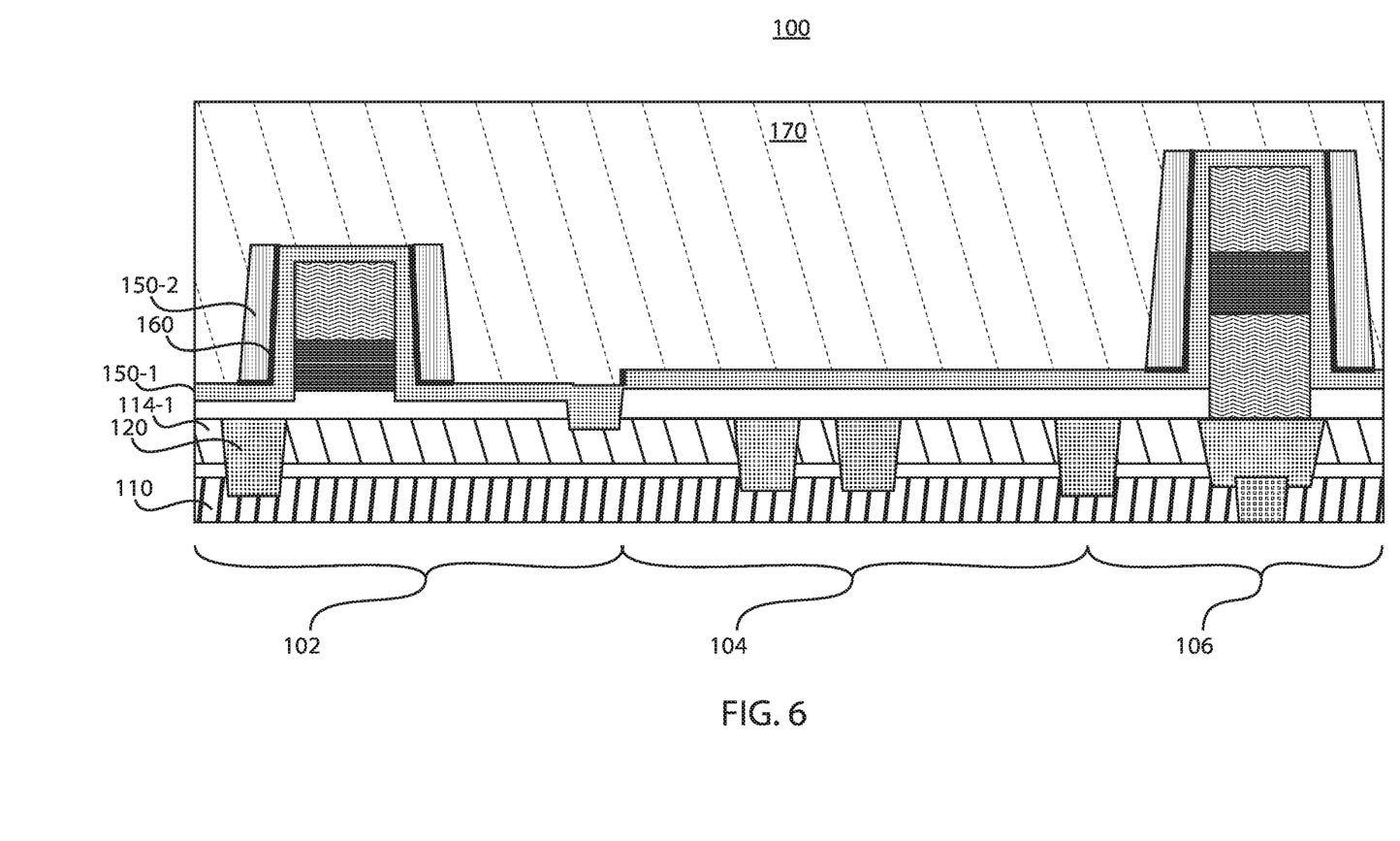
FIG. 6 is a cross-sectional view of the formation of an interlayer dielectric (ILD) during the fabrication of the semiconductor device, in accordance with an embodiment of the present invention.

With reference to FIG. 6, an interlayer dielectric (ILD) 170 is deposited on the device 100. The ILD 170 can include any suitable material in accordance with the embodiments described herein. For example, the ILD 170 can include, e.g., $SiO_2$. In one embodiment, the ILD can include a low-k dielectric material (e.g., a ULK dielectric material). Examples of suitable dielectric materials for the ILD 170 include, but are not limited to, a carbon doped oxide dielectric material (e.g., SiCOH), a fluorinated silicon oxide material (e.g., SiOF), a spin-on methyl-silisesquioxane (MSQ), an organic polymer, etc. (and combinations thereof).

Figure 7:
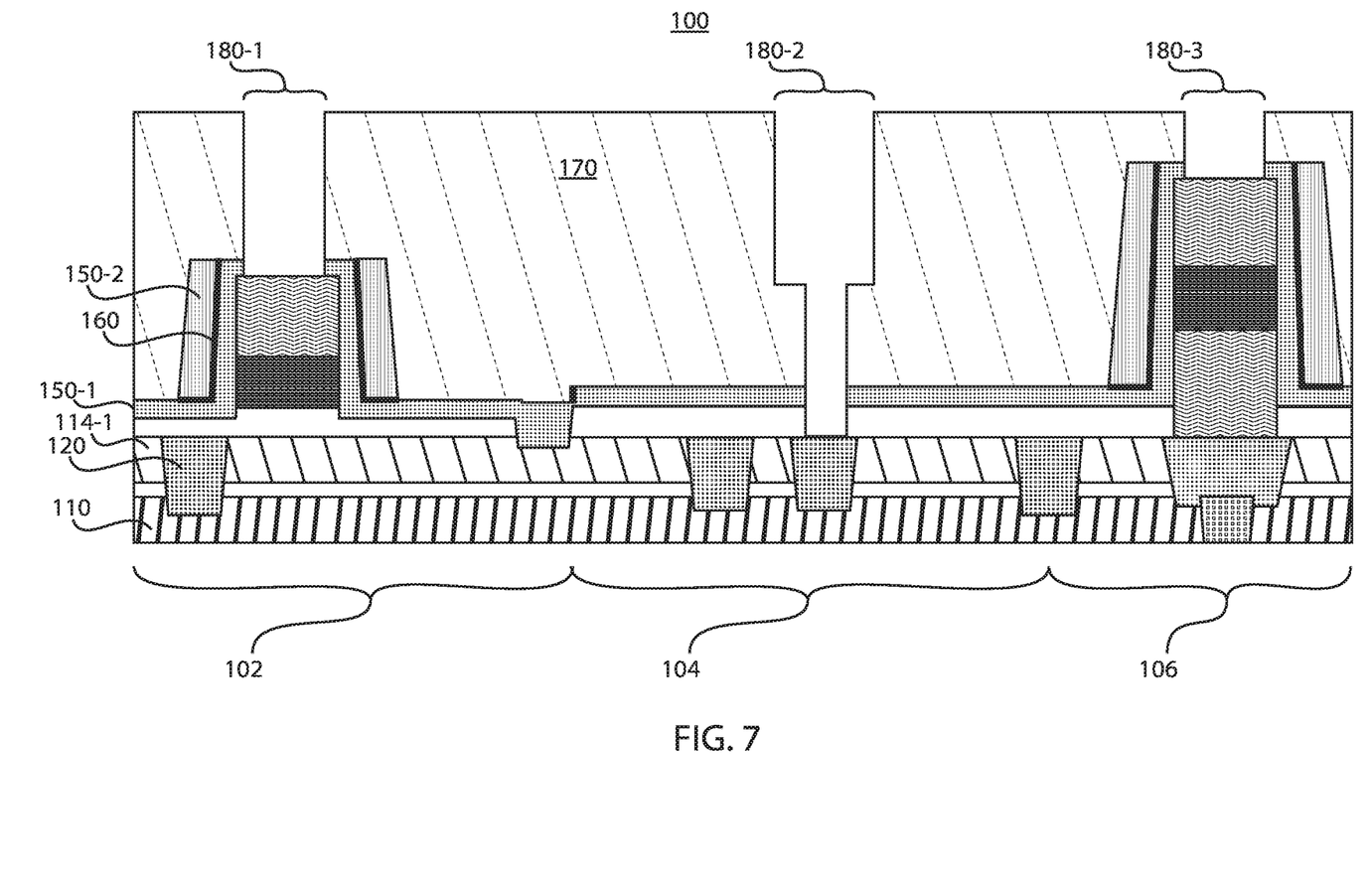
FIG. 7 is a cross-sectional view of top interconnects patterned during the fabrication of the semiconductor device, in accordance with an embodiment of the present invention.

With reference to FIG. 7, top interconnects 180-1 through 180-3 are patterned through the ILD 170. As shown, the top interconnect 180-1 corresponds to the alignment region 102, the top interconnect 180-2 corresponds to the logic region 104, and the top interconnect 180-3 corresponds to the memory region 106. The top interconnect 180-3 contacts the top electrode 146-2. Thus, each of the top interconnects 180-1 through 180-3 corresponds to a respective one of the regions of the device 100. Any suitable process can be used to pattern the top interconnects in accordance with the embodiments described herein.

Figure 8:
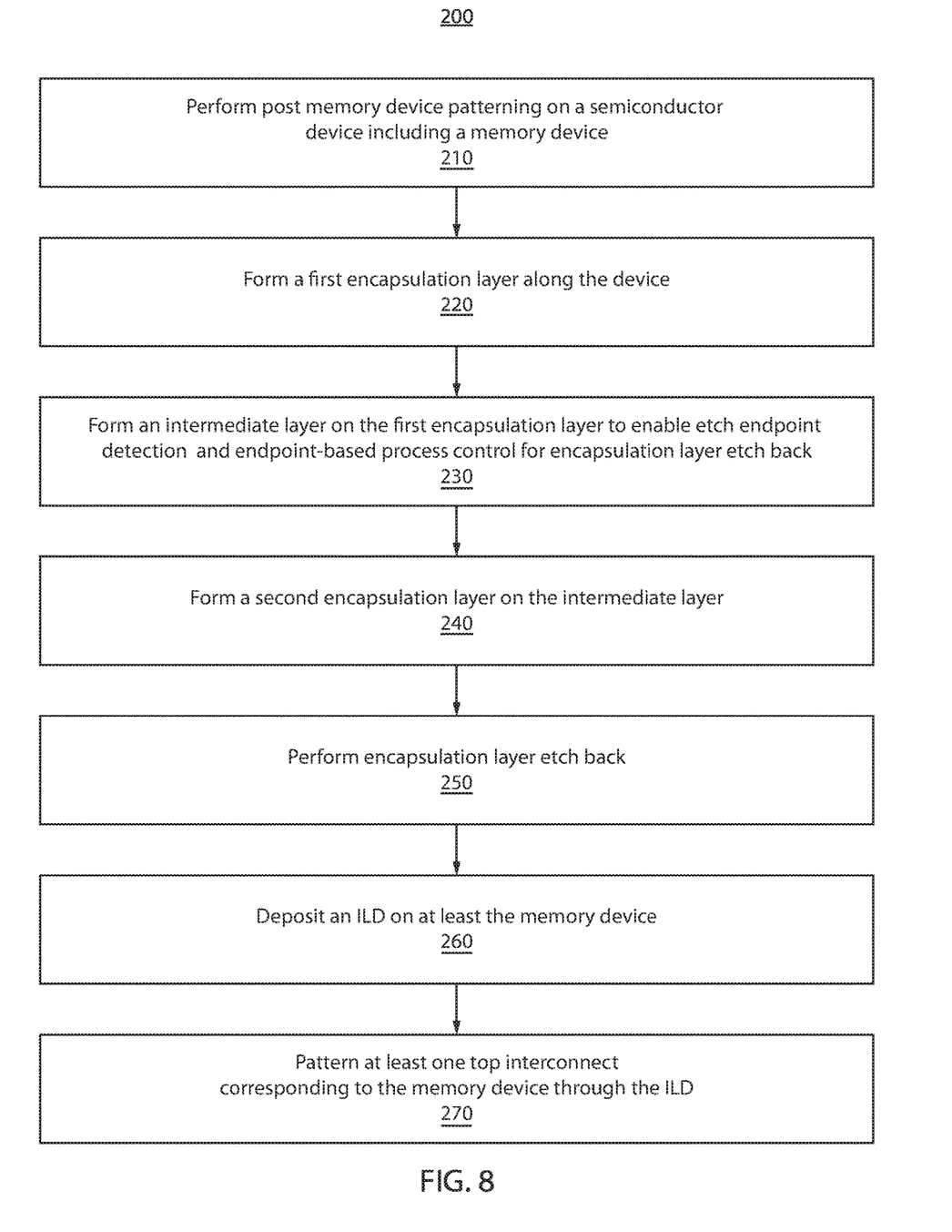
FIG. 8 is a block/flow diagram illustrating a system/method for fabricating a semiconductor device, in accordance with an embodiment of the present invention.

With reference to FIG. 8, a block/flow diagram is shown illustrating a system/method 200 for fabricating a semiconductor device.

At block 210, post memory device patterning is performed on a semiconductor device including a memory device. The memory device in accordance with the embodiments described herein can be embedded. In one embodiment, the memory device includes a magnetoresistive random-access memory (MRAM) device.

At block 220, a first encapsulation layer is formed along the device. Forming the first encapsulation layer along the device can include forming the first encapsulation layer along a memory region associated with the memory device.

Besides the memory region, the device can further include an alignment region and a logic region. In this embodiment, forming the first encapsulation layer along the device can include forming the first encapsulation layer along the alignment region, the logic region and the memory region. The first encapsulation layer can be formed to include any suitable material in accordance with the embodiments described herein. Examples of suitable materials for the first encapsulation layer include, but are not limited to, a silicon nitride material (e.g., SiN), a silicon carbide material (e.g., SiC), a silicon carbonitride material (e.g., SiCN), a silicon oxynitride material (e.g., SiON), a silicon oxycarbonitride material (e.g., SiCNO), a hafnium oxide material (e.g., $HfO_2$), an aluminum oxide material (e.g., $Al_2O_3$), etc. (and combinations thereof). The first encapsulation layer can be tuned for optimization of future encapsulation layers.

At block 230, an intermediate layer is formed on the first encapsulation layer to enable etch endpoint detection and endpoint-based process control for encapsulation layer etch back. The intermediate layer can include a material different from the first encapsulation layer. In one embodiment, the intermediate layer is formed as a thin layer. For example, the intermediate layer can be formed having a thickness of, e.g., at least about 5 nm. The intermediate layer can be formed to include any suitable material in accordance with the embodiments described herein. Examples of suitable materials for the intermediate layer include, but are not limited to, a silicon oxycarbide material (e.g., SiOC or SiCOH), a silicon nitride material (e.g., SiN), a silicon oxynitride material (SiON), a silicon carbonitride material (e.g., SiCN), a silicon oxycarbonitride material (e.g., SiCNO), an aluminum oxide material (e.g., $Al_2O_3$), an aluminum oxynitride material (e.g., $AlN_xO_y$), a hafnium oxide material (e.g., $HfO_2$), etc. (and combinations thereof).

In one embodiment, forming the intermediate layer can include conformally forming the material of the intermediate layer on the first encapsulation layer. For example, an oxygen bearing (e.g., oxygen gas ($O_2$), nitrous oxide ($N_2O$), carbon dioxide ($CO_2$), or carbon monoxide (CO)) plasma treatment can be used to modify the material of the first encapsulation layer. As another example, a nitrogen bearing (e.g., nitrogen gas ($N_2$) or ammonia ($NH_3$)) plasma treatment can be used to modify the dielectric material of the first encapsulation layer. As yet another example, a multi-step encapsulation layer deposition can be performed to obtain a precise thickness on the sidewalls and top.

In another embodiment, forming the intermediate layer can include non-conformally forming the material of the intermediate layer on the first encapsulation layer. For example, a thin film deposition process can be used to deposit a thin film of the material of the intermediate layer (e.g., employing CVD, PECVD, high density CVD (HDCVD), electron cyclotron resonance (ECR) and/or PVD). As another example, the intermediate layer can be formed by using spin coating or deposition of a flowable dielectric material (e.g., SiCN or SiCOH).

In yet another embodiment, forming the intermediate layer can include forming the material of the intermediate layer by using an implantation process to modify the first encapsulation layer. For example, the implantation can be done by using ion implantation, a gas cluster ion beam, an accelerated neutral atom beam, etc. The implantation species can be, e.g., carbon (C), oxygen (O), sulfur (S), nitrogen (N), or an oxidizable material. Examples of oxidizable materials include, but are not limited to, aluminum (Al), silicon (Si), hafnium (Hf), etc. (and combinations thereof).

At block 240, a second encapsulation layer is formed on the intermediate layer. For example, the second encapsulation layer can be conformally deposited along the intermediate layer using any suitable conformal deposition process. The second encapsulation layer can be formed to include any suitable material in accordance with the embodiments described herein. Examples of suitable materials for the second encapsulation layer include, but are not limited to, a silicon nitride material (e.g., SiN), a silicon carbide material (e.g., SiN), a silicon carbonitride material (e.g., SiCN), a silicon oxynitride material (e.g., SiON), a silicon oxycarbonitride material (e.g., SiCNO), a hafnium oxide material (e.g., $HfO_2$), an aluminum oxide material (e.g., $Al_2O_3$), etc. (and combinations thereof).

The second encapsulation layer can include a different material than the intermediate layer. In one embodiment, the second encapsulation layer can include the same material as the first encapsulation layer. In another embodiment, the second encapsulation layer can include a different material from the first encapsulation layer.

At block 250, encapsulation layer etch back is performed. As mentioned above, the intermediate layer formed to enable etch endpoint detection and endpoint-based process control for the encapsulation layer etch back. The encapsulation layer etch back process is stopped based on an end point signal once the top layer of encapsulation clears in the open area. Any suitable etch process can be used to perform the encapsulation layer etch back. In one embodiment, an anisotropic etch process can be used to perform the encapsulation layer etch back. As described above with reference to FIG. 5, this can result in the intermediate layer being removed from the lateral surface, but remaining on the sidewall due to slower etch rate at the sidewall caused by the anisotropic etch process. Additionally, the intermediate layer can prevent crack propagation between the first and second encapsulation layers. The first encapsulation layer can remain in the final product to meet total cap thickness requirements.

At block 260, an interlayer dielectric (ILD) is deposited on at least the memory device. The ILD can include any suitable material in accordance with the embodiments described herein. For example, the ILD can include, e.g., $SiO_2$. In one embodiment, the ILD can include a low-k dielectric material (e.g., a ULK dielectric material). Examples of suitable materials for the ILD formed at block 260 include, but are not limited to, a carbon doped oxide dielectric material (e.g., SiCOH), a fluorinated silicon oxide material (e.g., SiOF), a spin-on methyl-silisesquioxane (MSQ), an organic polymer, etc. (and combinations thereof).

At block 270, at least one top interconnect corresponding to the memory device is patterned through the ILD. In the embodiment in which the device includes an alignment region, a logic region and a memory region, a plurality of top interconnects can be patterned, with each of the top interconnects corresponding to one of the alignment region, the logic region and the memory region. Any suitable process can be used to pattern the at least one top interconnect in accordance with the embodiments described herein.

Further details regarding the process described with reference to blocks 210-270 of FIG. 8 are described above with reference to FIGS. 1-7.

Having described preferred embodiments of a semiconductor device and a method of fabricating the same (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed:

1. A method for fabricating a semiconductor device, comprising:
    forming a first encapsulation layer along the device, including forming the first encapsulation layer along a memory device region associated with a memory device;
    forming an intermediate layer on the first encapsulation layer, the intermediate layer having properties to enable etch endpoint detection and endpoint-based process control for stopping encapsulation layer etch back;
    forming a second encapsulation layer on the intermediate layer; and
    preventing crack propagation between the first and second encapsulation layers using the intermediate layer during the encapsulation layer etchback until an etch endpoint signal is reached to stop the encapsulation layer etch back, including anisotropically etching portions of the intermediate layer to exploit a slower sidewall etch rate of the intermediate layer as compared to a lateral surface etch rate of the intermediate layer.

2. The method of claim 1, wherein the memory device includes a magnetoresistive random-access memory (MRAM) device.

3. The method of claim 1, wherein forming the first encapsulation layer along the device further comprises forming the first encapsulation layer along an alignment region and a logic device region.

4. The method of claim 1, wherein forming the intermediate layer further includes forming the intermediate layer to have a thickness of at least about 5 nm.

5. The method of claim 1, wherein forming the intermediate layer further includes conformally forming the intermediate layer by applying a plasma treatment to modify the first encapsulation layer.

6. The method of claim 1, wherein forming the intermediate layer further includes non-conformally depositing the intermediate layer on the first encapsulation layer.

7. The method of claim 1, wherein forming the intermediate layer further includes forming the intermediate layer by using an implantation process to modify the first encapsulation layer.

8. The method of claim 1, further comprising:
    depositing an interlayer dielectric (ILD) on the memory device after performing the encapsulation layer etch back; and
    patterning at least one top interconnect through the ILD corresponding to the memory device.

9. A method for fabricating a semiconductor device including a memory device, comprising:
    forming a first encapsulation layer along the device, including forming the first encapsulation layer along a memory device region associated with a magnetoresistive random-access memory (MRAM) device;
    forming an intermediate layer on the first encapsulation layer, the intermediate layer having properties including having a thickness of at least about 5 nm to enable etch endpoint detection and endpoint-based process control for stopping encapsulation layer etch back;
    forming a second encapsulation layer on the intermediate layer; and
    preventing crack propagation between the first and second encapsulation layers using the intermediate layer during the encapsulation layer etchback until an etch endpoint signal is reached to stop the encapsulation layer etch back, including anisotropically etching portions of the intermediate layer to exploit a slower sidewall etch rate of the intermediate layer as compared to a lateral surface etch rate of the intermediate layer.

10. The method of claim 9, wherein forming the first encapsulation layer along the device further comprises forming the first encapsulation layer along an alignment region and a logic device region.

11. The method of claim 9, wherein forming the intermediate layer further includes conformally forming the intermediate layer by applying a plasma treatment to modify the first encapsulation layer.

12. The method of claim 9, wherein forming the intermediate layer further includes non-conformally depositing the intermediate layer on the first encapsulation layer.

13. The method of claim 9, wherein forming the intermediate layer further includes forming the intermediate layer by using an implantation process to modify the first encapsulation layer.

14. The method of claim 9, further comprising:
    depositing an interlayer dielectric (ILD) on the memory device after performing the encapsulation layer etch back; and
    patterning at least one top interconnect through the ILD corresponding to the memory device.

15. A semiconductor device, comprising:
    a plurality of horizontally adjacent regions, including an alignment region, a logic device region and a memory device region associated with a memory device;
    a first encapsulation layer disposed along the memory device region;
    an intermediate layer having a thickness of at least about 5 nm disposed on the first encapsulation layer; and
    a second encapsulation layer disposed on the intermediate layer.

16. The device of claim 15, wherein the intermediate layer has a different composition than the first and second encapsulation layers.

17. The device of claim 15, further comprising:
    an interlevel dielectric (ILD) disposed on the intermediate layer and the second encapsulation layer; and
    at least one top interconnect patterned through the ILD corresponding the memory device.

18. The device of claim 15, further comprising a trench disposed between the alignment region and the logic region, wherein the memory device includes a magnetoresistive random-access memory (MRAM) device.

* * * * *